(12) United States Patent
Takenaka (10) Patent No.: US 9,348,241 B2
(45) Date of Patent: May 24, 2016

(54) EXPOSURE APPARATUS AND DEVICE MANUFACTURING METHOD

(75) Inventor: Tsutomu Takenaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1260 days.

(21) Appl. No.: 12/247,294

(22) Filed: Oct. 8, 2008

(65) Prior Publication Data

US 2009/0103067 A1 Apr. 23, 2009

(30) Foreign Application Priority Data

Oct. 18, 2007 (JP) ................................. 2007-271782

(51) Int. Cl.
| | |
|---|---|
| *G03B 27/42* | (2006.01) |
| *G03B 27/58* | (2006.01) |
| *G03B 27/62* | (2006.01) |
| *G03B 27/32* | (2006.01) |
| *G03F 9/00* | (2006.01) |
| *G03F 7/20* | (2006.01) |

(52) U.S. Cl.
CPC .............. *G03F 9/7088* (2013.01); *G03B 27/42* (2013.01); *G03F 7/70775* (2013.01)

(58) Field of Classification Search
CPC . G03F 7/70775; G03F 9/7088; G03F 9/7092; G03F 9/7073; G03F 9/7003; G03F 9/7023; G03F 9/70
USPC ........................ 355/52, 53, 55, 61, 72, 75, 77; 356/399–401; 378/34, 205, 206
See application file for complete search history.

(56) References Cited

U.S. PATENT DOCUMENTS

| | | | | |
|---|---|---|---|---|
| 4,629,313 A | * | 12/1986 | Tanimoto | 355/53 |
| 4,725,737 A | * | 2/1988 | Nakata et al. | 250/548 |
| 4,746,958 A | * | 5/1988 | Yamakawa | 355/68 |
| 5,117,254 A | * | 5/1992 | Kawashima et al. | 355/43 |
| 5,142,156 A | * | 8/1992 | Ozawa et al. | 250/548 |
| 5,377,009 A | * | 12/1994 | Kitaoka et al. | 356/401 |
| 5,671,057 A | * | 9/1997 | Kawai | 356/399 |
| 5,721,607 A | * | 2/1998 | Ota | G03F 9/70 |
| | | | | 250/559.3 |
| 5,753,926 A | * | 5/1998 | Sato | 250/548 |
| 6,151,121 A | * | 11/2000 | Mishima | 356/399 |

(Continued)

FOREIGN PATENT DOCUMENTS

| | | | |
|---|---|---|---|
| JP | 2007-250947 A | | 9/2007 |
| KR | 10-0525067 B | | 12/2005 |

*Primary Examiner* — Christina Riddle (74) *Attorney, Agent, or Firm* — Canon USA, Inc., IP Division (57) ABSTRACT

An exposure apparatus comprises an original stage which holds an original, a substrate stage which holds a substrate, and a control unit which controls a measurement process of measuring a relative position between the original and substrate stages, wherein original-side measurement marks including an original-side rough-measurement mark and an original-side fine-measurement mark are formed on the original stage, substrate-side measurement marks including a substrate-side rough-measurement mark and a substrate-side fine-measurement mark are formed on the substrate stage, and the control unit controls the measurement process to perform rough measurement of the relative position between the original and substrate stages using the original-side and the substrate-side rough-measurement marks, correct the relative position between the original and substrate stages based on the result of the rough measurement, and then perform fine measurement of the relative position between the original and substrate stages using the original-side and substrate-side fine-measurement marks.

8 Claims, 8 Drawing Sheets

(56) References Cited

U.S. PATENT DOCUMENTS

| | | |
|---|---|---|
| 6,456,377 B1 | 9/2002 | Suzuki et al. |
| 2002/0024646 A1* | 2/2002 | Hiura ............................. 355/53 |
| 2004/0032575 A1* | 2/2004 | Nishi et al. ..................... 355/53 |
| 2004/0204901 A1* | 10/2004 | Hayashi ....................... 702/150 |
| 2004/0227925 A1* | 11/2004 | Sato ................................ 355/72 |
| 2005/0053273 A1 | 3/2005 | Ostrom et al. |
| 2005/0068508 A1* | 3/2005 | Mattiza ................ G03F 9/7076 355/55 |
| 2005/0189502 A1* | 9/2005 | Van Bilsen et al. ......... 250/559.3 |
| 2005/0281454 A1* | 12/2005 | Miyashita .................... 382/145 |
| 2007/0296945 A1 | 12/2007 | Miura |

* cited by examiner

FIG. 9A SEQUENCE A

FIG. 9B SEQUENCE B

SEQUENCE C

FIG. 10A

SEQUENCE D

EXPOSURE APPARATUS AND DEVICE MANUFACTURING METHOD

BACKGROUND OF THE INVENTION

1. Field of the Invention

The present invention relates to an exposure apparatus which projects the pattern of an original onto a substrate by a projection optical system, thereby exposing the substrate, and a device manufacturing method.

2. Description of the Related Art

In a lithography process for manufacturing devices such as a semiconductor device and liquid crystal panel, the pattern of a reticle (original) is transferred onto a wafer (substrate), which is coated with a photosensitive agent (photoresist), via a projection optical system.

Amid an increase in the packing density of devices, the substrate micropatterning technique is greatly advancing. Exposure apparatuses called a stepper and scanner play central roles in advancing the micropatterning technique. The stepper is a reduction exposure apparatus which forms an image of the pattern of a reticle on a wafer by a projection optical system, and exposes the wafer by the step & repeat scheme. The scanner is an exposure apparatus which exposes a wafer while synchronously scanning it and a reticle.

TTL measurement is known as a method of relative alignment between a reticle (original) and a wafer (substrate) in the exposure apparatus (Japanese Patent Laid-Open No. 2007-250947). In the TTL measurement, measurement for relative alignment between original-side measurement marks formed on the reticle or a fiducial plate arranged in its vicinity, and substrate-side measurement marks formed on the wafer or its vicinity is performed via the projection optical system. Measurement of this scheme is called TTL measurement. In the TTL measurement, light including the same wavelength as that of the exposure light is generally used as the measurement light.

The resolution limit of the exposure apparatus is proportional to the exposure wavelength and is inversely proportional to the numerical aperture of the projection optical system. In view of this, the exposure apparatus has been developed by shortening the exposure wavelength and increasing the numerical aperture of the projection optical system, in order to improve the resolution limit. Note, however, that the depth of focus of the projection optical system is proportional to the exposure wavelength and is inversely proportional to the square of the numerical aperture of the projection optical system. According to this principle, as the resolution of the exposure apparatus increases, the depth of focus decreases rapidly, so a demand for the accuracy of focusing based on TTL measurement is becoming stricter.

In addition, as the resolution limit improves, the line width of devices decreases, so a demand for the accuracy of alignment on a plane perpendicular to the optical axis, which is based on TTL measurement, is also becoming stricter.

To meet these demands, an image obtained by projecting an alignment pattern used in TTL measurement via the projection optical system is desirably close to a device image.

The exposure apparatus is also being required to attain a high throughput, in order to mass-produce devices in a short period of time. In recent years, an exposure apparatus having two wafer stages, an exposure station for exposing a wafer, and a measurement station for measuring the wafer to obtain information used to align the original and each shot region on the wafer is becoming prevalent. Such an exposure apparatus is called, for example, a twin-stage exposure apparatus. The twin-stage exposure apparatus can measure one wafer while exposing another, thus attaining a high throughput.

In the twin-stage exposure apparatus, the first wafer is measured in the measurement station, and then the wafer stage holding the first wafer moves from the measurement station to the exposure station so that the wafer is exposed while being aligned based on the measurement. While the first wafer is exposed, the second wafer is loaded onto the other wafer stage and measured in the measurement station. After the exposure of the first wafer and the measurement of the second wafer are completed, the wafer stage holding the first wafer moves from the exposure station to the measurement station. At the same time, the wafer stage holding the second wafer moves from the measurement station to the exposure station. The operation of swapping these two wafer stages between the exposure station and the measurement station can be called a swap operation.

An optical measuring device is generally used to control the position of the wafer stage upon driving it. The optical measuring device must continuously measure the measurement surface of the wafer stage. Note, however, that different measuring devices are used for the measurement station and the exposure station in the twin-stage exposure apparatus. To maintain the continuity of the measurement results, the position information of the wafer stage, which is measured in one station (e.g., the measurement station), is passed to a system for controlling the position of the wafer stage in the other station (e.g., the exposure station) when the wafer stage moves to the other station.

Unfortunately, the wafer stage can be hardly moved from one station to the other station without any position error, so a so-called swap error occurs during the swap operation. For this reason, TTL measurement is required to be performed in the exposure station with high measurement accuracy even when a swap error exists. However, along with the advance of the micropatterning of devices, the required measurement accuracy becomes stricter, so a measurement pattern for TTL measurement is miniaturized along with the advance of the micropatterning of devices. Because the miniaturization of the measurement pattern inevitably reduces the measurement possible range, a swap error, if any, makes measurement erroneous, if not impossible.

As a measure for solving this problem, a measuring system different from that for TTL measurement can be provided additionally. However, adding a new measuring system increases the complexity, size, and cost of the apparatus. In addition, a control mechanism, adjustment, calibration, and the like become necessary to correct the difference between the measurement result obtained by the TTL measurement and that obtained by the different measuring system. This increases the time and cost consumed in the manufacture and maintenance of the exposure apparatus.

A situation under which the continuity of the measurement results obtained by the optical measuring devices breaks is not particularly limited to the above-described example, and it is also encountered when, for example, the exposure apparatus or measuring devices are initialized, maintained, or started up. Under these situations, a failure in TTL measurement occurs for the above-described reasons again.

SUMMARY OF THE INVENTION

The present invention has been made in consideration of the above-described problems, and has as its object to, for example, widen the measurement possible range while maintaining the position measurement accuracy of a substrate stage without complicating the arrangement of an exposure apparatus.

One aspect of the present invention relates to an exposure apparatus which projects the pattern of an original onto a substrate by a projection optical system, thereby exposing the substrate. The exposure apparatus includes an original stage which holds the original, a substrate stage which holds the substrate, and a control unit which controls a measurement process of measuring the relative position between the original stage and the substrate stage. Original-side measurement marks including an original-side rough-measurement mark and an original-side fine-measurement mark are formed on the original stage. Substrate-side measurement marks including a substrate-side rough-measurement mark and a substrate-side fine-measurement mark are formed on the substrate stage. The control unit controls the measurement process to perform rough measurement of the relative position between the original stage and the substrate stage using the original-side rough-measurement mark and the substrate-side rough-measurement mark, correct the relative position between the original stage and the substrate stage based on the result of the rough measurement, and then perform fine measurement of the relative position between the original stage and the substrate stage using the original-side fine-measurement mark and the substrate-side fine-measurement mark.

According to the present invention, it is possible to, for example, widen the measurement possible range while maintaining the position measurement accuracy of a substrate stage without complicating the arrangement of an exposure apparatus.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings. The same reference numerals denote the same elements throughout the specification and accompanying drawings. Also throughout the specification and accompanying drawings, a description will be given assuming that a direction parallel to the optical axis of a projection optical system is the Z direction, and two orthogonal directions on a plane perpendicular to the Z-axis direction are the X and Y directions. The Z direction will also be called the focusing direction.

First Embodiment

Figure 1:
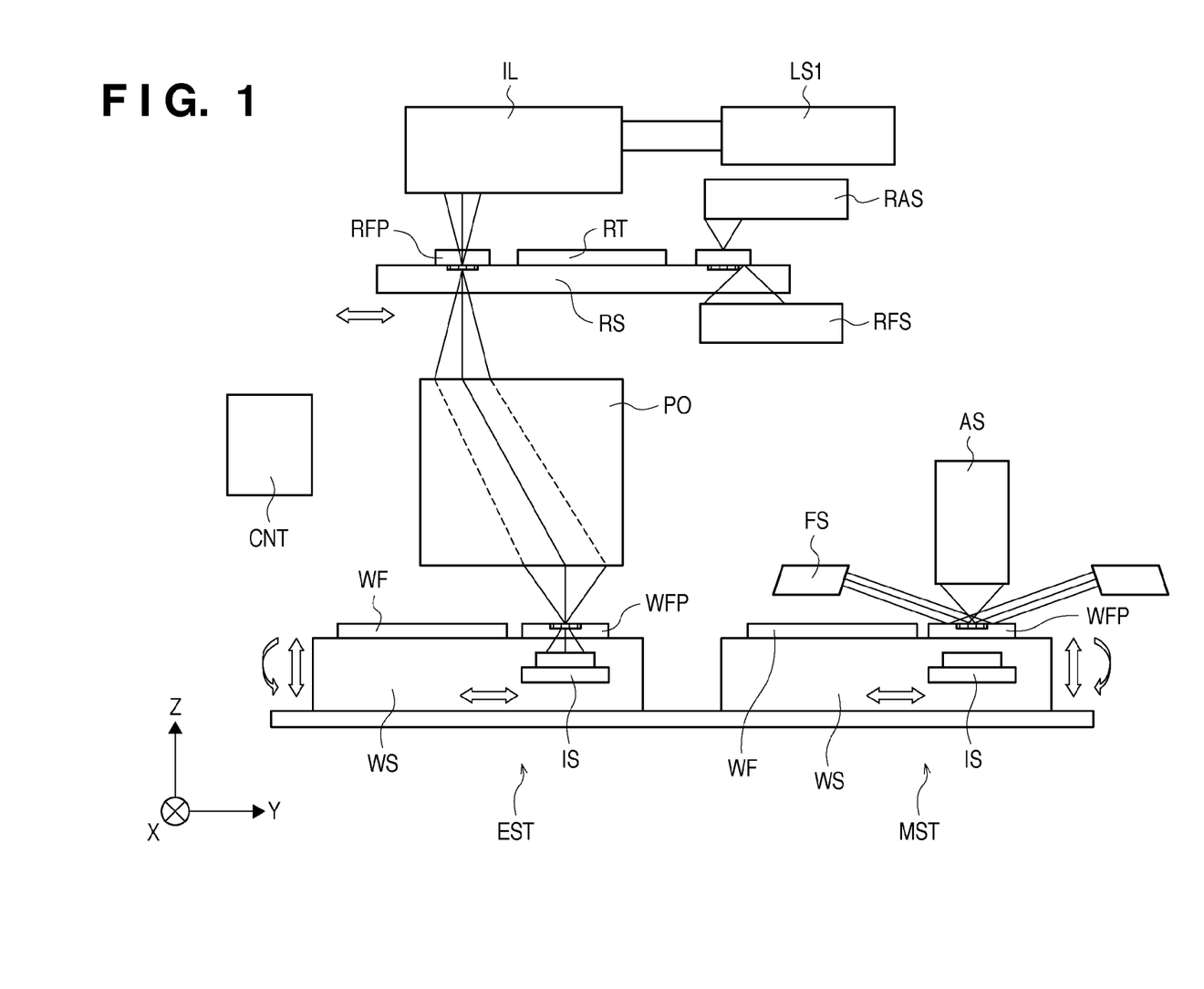
FIG. 1 is a view showing the schematic arrangement of an exposure apparatus according to the first embodiment of the present invention.

FIG. 1 is a view showing the schematic arrangement of an exposure apparatus according to the first embodiment of the present invention. The exposure apparatus comprises a control unit CNT. The control unit CNT controls, for example, a measurement process of measuring the relative position between a reticle stage (original stage) RS and a wafer stage (substrate stage) WS. The control unit CNT can perform other various kinds of control.

Light emitted by a light source LS1 enters an illumination optical system IL to form, on a reticle (original) RT, a band-like exposure region extending in the X direction or an arcuated exposure region. The reticle RT and a wafer (substrate) WF are placed at nearly optically conjugate positions (the object plane and image plane of a projection optical system PO) via the projection optical system PO. The reticle RT is held by the reticle stage RS, while the wafer WF is held by the wafer stage WS. The pattern of the reticle RT is projected onto the wafer WF by moving both the reticle stage RS and wafer stage WS relative to the projection optical system PO at a speed ratio matching the optical magnification of the projection optical system PO. As the pattern of the reticle RT is projected onto the wafer WF, the wafer WF is exposed so that a photosensitive agent applied on the wafer WF is exposed.

The reticle stage RS which holds the reticle RT is driven in the Y direction by a position control mechanism including a laser interferometer (position measuring device) and a driving mechanism. A reticle-side fiducial plate (original-side fiducial plate) RFP is arranged in a predetermined range on the reticle stage RS near the reticle RT. The pattern surface of the reticle-side fiducial plate RFP is set to be flush with the pattern surface of the reticle RT.

Figure 2A:
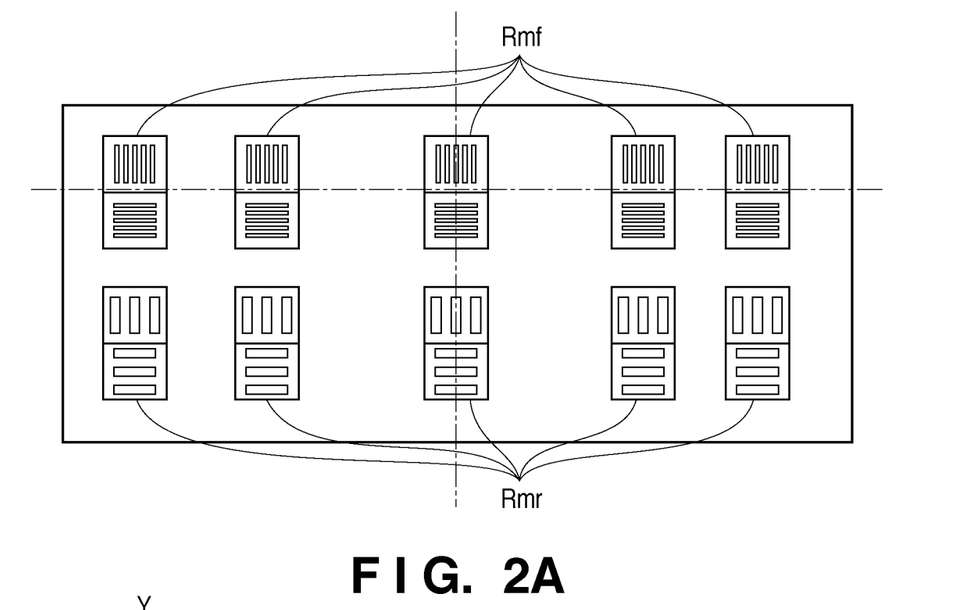
FIG. 2A is a view illustrating a mark array on a reticle-side fiducial plate RFP.

Original-side measurement marks made of a metal such as Cr, Al, or Ta are formed on the pattern surface of the reticle-side fiducial plate RFP. More specifically, a plurality of original-side fine-measurement marks Rmf and a plurality of original-side rough-measurement marks Rmr are formed on the reticle-side fiducial plate RFP as the original-side measurement marks to allow the measurement at a plurality of image heights in the exposure region, as illustrated in FIG. 2A.

Figure 2B:
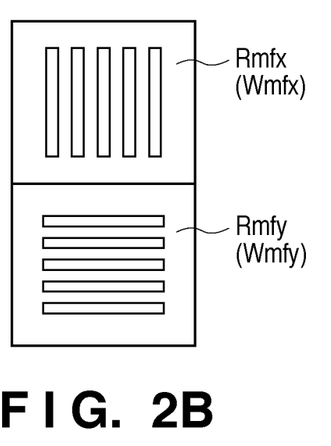
FIG. 2B is a view illustrating fine-measurement marks.
Figure 2C:
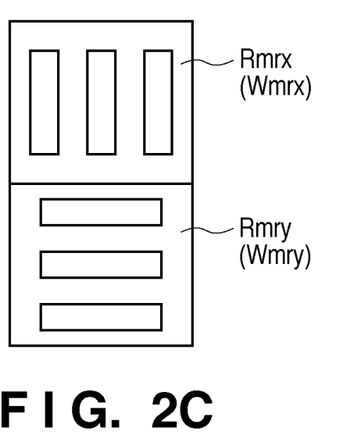
FIG. 2C is a view illustrating rough-measurement marks.

The original-side fine-measurement marks Rmf are illustrated in FIG. 2B and are, for example, line & space patterns having, as their spaces, rectangular openings each with a width around the exposure resolution line width on the scale of the original. The original-side rough-measurement marks Rmr are illustrated in FIG. 2C and are, for example, line & space patterns having, as their spaces, rectangular openings each with a width larger than the exposure resolution line width on the scale of the original. For the sake of convenience, marks having lines in a direction perpendicular to the X direction are defined as Rmfx and Rmrx, and those having lines in a direction perpendicular to the Y direction are defined as Rmfy and Rmry herein. However, the marks Rmf and Rmr are not particularly limited to these marks, and may be, for example, line & space patterns each having a predetermined angle with respect to the X direction.

In the example shown in FIG. 1, two reticle-side fiducial plates RFP are arranged across the reticle RT in the Y direction as the scanning direction. However, one or three or more reticle-side fiducial plates RFPs may be provided.

The exposure apparatus comprises a reticle alignment sensor RAS and reticle focus sensor RFS as measuring devices which measure the relative position between the reticle-side fiducial plate RFP and the reticle RT. The reticle alignment sensor RAS can include, for example, a two-dimensional image sensing element and optical element. Moving the reticle alignment sensor RAS or reticle stage RS makes it possible to measure the relative position between the reticle-side fiducial plate RFP and the reticle RT in the X and Y directions. Although one reticle alignment sensor RAS is provided in FIG. 1, two or more reticle alignment sensors RAS may be provided. For example, arranging two reticle alignment sensors RAS at a certain interval in the X direction makes it possible to measure the magnification in the X direction and the rotation about the Z-axis for the reticle RT. Also, arranging two reticle alignment sensors RAS at a certain interval in the Y direction makes it possible to measure the magnification in the Y direction and the rotation about the Z-axis for the reticle RT.

An oblique-incidence sensor, for example, can be used as the reticle focus sensor RFS. Moving the reticle focus sensor RFS or reticle stage RS makes it possible to measure the relative position between the reticle-side fiducial plate RFP and the reticle RT in the Z direction. Although one reticle focus sensor RFS is provided in FIG. 1, two or more reticle focus sensors RFS may be provided. For example, arraying a plurality of reticle focus sensors RFS in the X direction, and moving the reticle stage RS in the Y direction makes it possible to measure the relative position between the reticle-side fiducial plate RFP and the reticle RT in the Z direction as a projection/recess on the X-Y plane.

As a substrate-side pattern, a wafer-side fiducial plate (substrate-side fiducial plate) WFP is arranged in a predetermined range on the wafer stage WS near the wafer WF. The surface of the wafer-side fiducial plate WFP is set to be flush with the upper surface of the wafer WF.

Substrate-side position measurement marks made of a metal such as Cr, Al, or Ta are formed on the surface of the wafer-side fiducial plate WFP. The substrate-side position measurement marks include a plurality of substrate-side fine-measurement marks Wmf and a plurality of substrate-side rough-measurement marks Wmr.

The substrate-side fine-measurement marks Wmf are illustrated in FIG. 2B and are, for example, line & space patterns having, as their spaces, rectangular openings each with a width around the exposure resolution line width. The substrate-side rough-measurement marks Wmr are illustrated in FIG. 2C and are, for example, line & space patterns having, as their spaces, rectangular openings each with a width larger than the exposure resolution line width. For the sake of convenience, marks having lines in a direction perpendicular to the X direction are defined as Wmfx and Wmrx, and those having lines in a direction perpendicular to the Y direction are defined as Wmfy and Wmry herein. However, the substrate-side position measurement marks Wmf and Wmr are not particularly limited to these marks, and may be, for example, line & space patterns each having a predetermined angle with respect to the X direction.

On the wafer stage WS, a photosensor IS for detecting the amounts of light beams transmitted through the marks Wmf and Wmr is arranged below them. Although only one set of the plate WFP and photosensor IS is provided on the wafer stage WS in FIG. 1, the number of sets of them is not particularly limited to this, and two or more sets of them may be provided.

The wafer stage WS is controlled in six axial directions, that is, the optical axis direction of the projection optical system PO (Z direction), two directions on a plane (X-Y plane) perpendicular to the optical axis direction, the rotation direction about the optical axis (θ direction), and the tilt directions with respect to the image plane.

A moving mirror for reflecting a beam from a laser interferometer (position measuring device) is fixed on the wafer stage WS so that the laser interferometer measures the position of the wafer stage WS.

The exposure apparatus according to the preferred embodiment of the present invention shown in FIG. 1 is configured as a twin-stage exposure apparatus and has two wafer stages WS. While one wafer stage WS is set in an exposure station EST for exposure, the other wafer stage WS is set in a measurement station MST for alignment measurement. Note that the alignment measurement in the measurement station MST includes measurement for obtaining information used to align the reticle RT and each shot region on the wafer WF.

In the measurement station MST, a focus sensor FS and alignment sensor AS are arranged. The position of the wafer stage WS set in the exposure station EST is measured by a laser interferometer for the exposure station EST. The position of the wafer stage WS set in the measurement station MST is measured by a laser interferometer for the measurement station MST.

After the exposure of the wafer held by one wafer stage WS and the measurement of the wafer held by the other wafer stage WS are completed, the two wafer stages WS are swapped, that is, a swap operation is performed. In this swap operation, the measurement of the wafer stages WS by the respective laser interferometers is interrupted. That is, when attention is paid to one wafer stage WS, a laser interferometer for measuring its position is switched. In switching the laser interferometer of this role, the measurement result obtained by one laser interferometer is passed to the other interferometer. At this time, a swap error, that is, a position error occurs.

Although the exposure apparatus in this embodiment has a twin-stage configuration, the numbers of wafer stages and stations may be three or more. In this case, the numbers of wafer stages and stations may be the same or different.

In this embodiment, TTL measurement using the reticle-side fiducial plate RFP and wafer-side fiducial plate WFP includes a rough-measurement process and a subsequent fine-measurement process, and is controlled by the control unit CNT. For the sake of descriptive convenience, the fine-measurement process will be described first.

In the fine-measurement process, of the original-side fine-measurement marks Rmf and original-side rough-measurement marks Rmr formed on the reticle-side fiducial plate RFP, the original-side fine-measurement marks Rmf are used as the original-side measurement marks. Also in the fine-measurement process, of the substrate-side fine-measurement marks Wmf and substrate-side rough-measurement marks Wmr formed on the wafer-side fiducial plate WFP, the substrate-side fine-measurement marks Wmf are used as the substrate-side measurement marks. More specifically, the original-side fine-measurement marks Rmf are illuminated by the illumination optical system IL, and the light transmitted through the original-side fine-measurement marks Rmf is guided to the substrate-side fine-measurement marks Wmf on the wafer-side fiducial plate WFP via the projection optical system PO.

Then, the photosensor IS detects the amount of light transmitted through the substrate-side fine-measurement marks Wmf.

Figure 3:
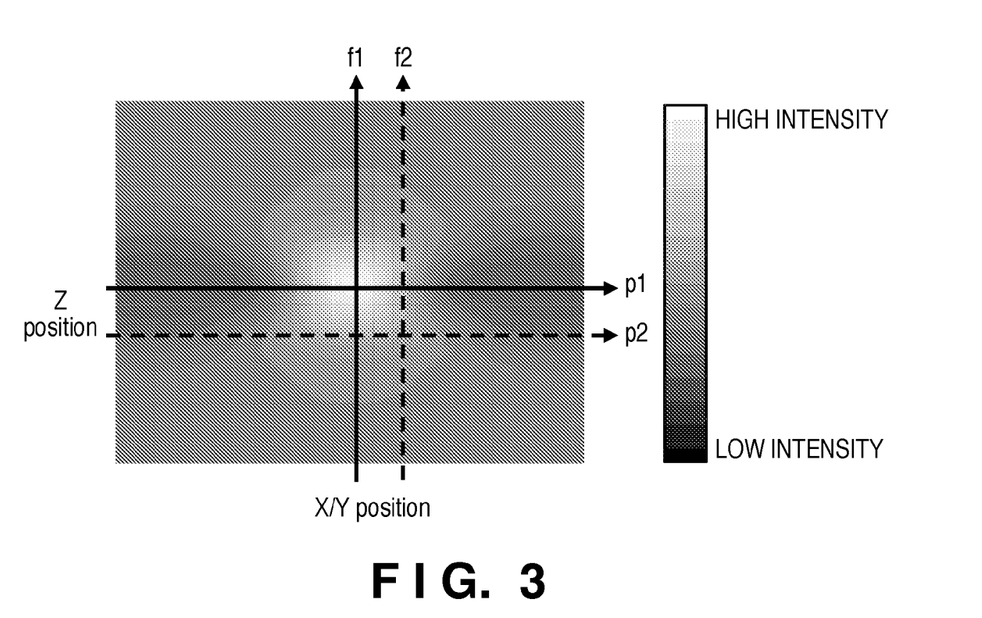
FIG. 3 is a chart illustrating an image intensity distribution on the Z-X plane, which is obtained by using the fine-measurement marks.

FIG. 3 is a chart illustrating an image intensity distribution on the Z-X plane, which is obtained by using the fine-measurement marks. FIG. 3 shows an intensity distribution calculated when an ideal projection optical system PO free from any aberration is used. In the actual measurement, such an intensity distribution is obtained by monitoring the output from the photosensor IS while moving the substrate-side fine-measurement marks Wmf. Referring to FIG. 3, the abscissa indicates the position in the X or Y direction, and the ordinate indicates the position in the Z direction.

An example of focus measurement (position measurement in the Z direction) will be explained below. First, the reticle stage RS is driven so that the marks Rmf are set at a predetermined image height in the exposure region. Next, the wafer stage WS is driven so that the marks Wmf are set near the focus positions of the marks Rmf. Lastly, the photosensor IS detects the amount of light transmitted through the marks Wmf while driving the wafer stage WS in the optical axis direction of the projection optical system PO.

Figure 4:
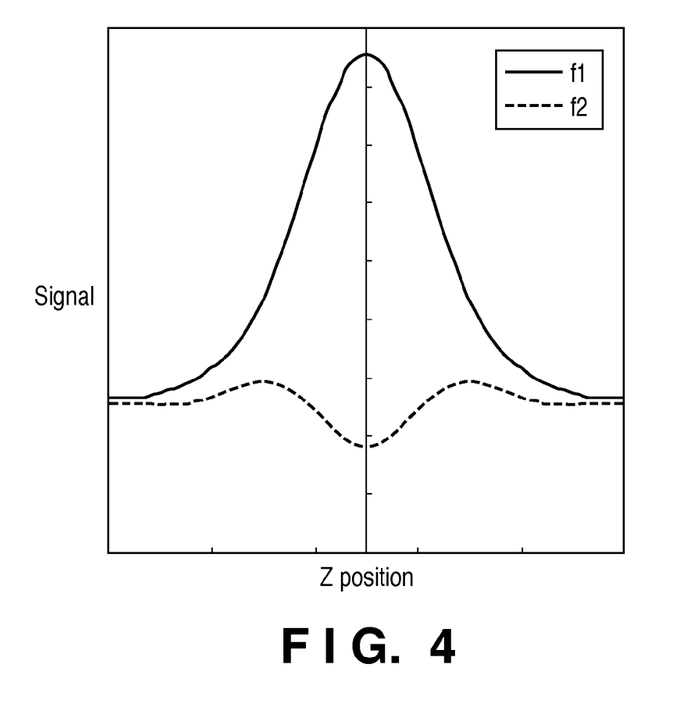
FIG. 4 is a chart illustrating signal waveforms obtained by using the fine-measurement marks.

For example, when the measurement (the monitoring of the output from the photosensor IS) is performed while changing the position of the wafer stage WS in the Z direction (focusing direction) as indicated by f1 in FIG. 3, a measurement waveform as indicated by f1 in FIG. 4 (a sectional view taken along f1 in FIG. 3) can be obtained. In this case, detecting a position at which the amount of light is a maximum makes it possible to calculate a best focus position of the projection optical system PO at an image height corresponding to this position. f1 indicates a case in which focus measurement is performed by setting the position in the X and Y directions as a best focus position. If the position in the X and Y directions is not a best focus position, for example, the measurement waveform comes under an adverse influence of this misalignment, as indicated by f2 in FIG. 4. The measurement waveform as indicated by f2 in FIG. 4 has low contrast, which results in erroneous measurement and in a decrease in measurement accuracy.

An example of position measurement in a direction perpendicular to the optical axis (typically, the horizontal direction), that is, in the X or Y direction will be explained next. Like the focus measurement, the reticle stage RS is driven so that the marks Rmf are set at a predetermined image height in the exposure region. Next, the wafer stage WS is driven so that the marks Wmf are set near the focus positions of the marks Rmf. The photosensor IS detects the amount of light transmitted through the substrate-side fine-measurement marks Wmf while driving the wafer stage WS in a direction perpendicular to the optical axis of the projection optical system PO.

Figure 5:
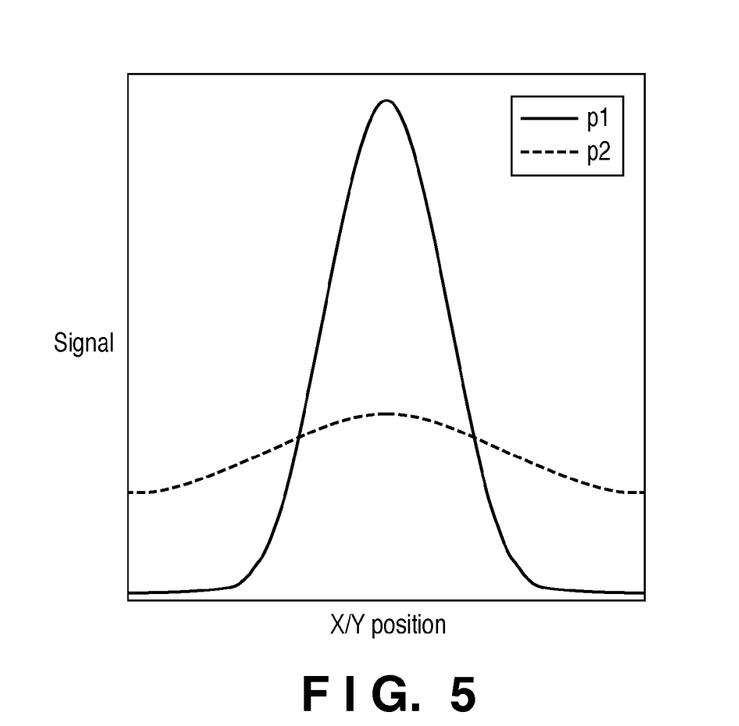
FIG. 5 is a chart illustrating signal waveforms obtained by using the fine-measurement marks.

For example, when the measurement (the monitoring of the output from the photosensor IS) is performed while changing the position of the wafer stage WS in the X or Y direction as indicated by p1 in FIG. 3, a measurement waveform as indicated by p1 in FIG. 5 can be obtained. In this case, detecting a position at which the amount of light is a maximum makes it possible to calculate a best focus position of the projection optical system PO at an image height corresponding to this position. p1 indicates a case in which position measurement in a direction perpendicular to the optical axis is performed by setting the position in the Z direction (focusing direction) as a best focus position. If the position in the Z direction is not a best focus position, for example, the measurement waveform comes under an adverse influence of this misalignment, as indicated by p2 in FIG. 4. The measurement waveform as indicated by p2 in FIG. 4 has low contrast, which results in erroneous measurement and in a decrease in measurement accuracy.

In the position measurement in a direction perpendicular to the optical axis, when the wafer stage WS is driven in the X direction, the position (the relative position between the reticle stage RS and the wafer stage WS) in the X direction is measured using the marks Wmfx. When the wafer stage WS is driven in the Y direction, the position (the relative position between the reticle stage RS and the wafer stage WS) in the Y direction is measured using the marks Wmfy. Measurement in at least two directions allows alignment on a plane perpendicular to the optical axis of the projection optical system PO (alignment between the reticle stage RS and the wafer stage WS). The direction in which the lines of the substrate-side patterns extend, and that in which the wafer stage WS is driven are not particularly limited to the above-described cases. For example, if line patterns are used, a measurement value need only be obtained by using two or more arbitrary substrate-side patterns (line patterns), and driving the wafer stage WS in two or more arbitrary directions. Then, it is possible to perform alignment on a plane perpendicular to the optical axis of the projection optical system PO, based on the measurement value.

As described above, when the fine-measurement process is performed using the marks Rmf and Wmf as patterns each with a line width around the exposure resolution line width, the vicinity of the center of the image intensity distribution is desirably scanned and measured. That is, focus measurement is desirably performed by driving the wafer stage WS in the focusing direction so that its position in a direction perpendicular to the optical axis becomes an optimal position or its vicinity. Also, position measurement in a direction perpendicular to the optical axis is desirably performed by driving the wafer stage WS so that its position in the focusing direction becomes an optimal position or its vicinity.

However, a swap error occurs upon swapping the wafer stages WS in, for example, a twin-stage exposure apparatus. This swap error has an adverse influence on TTL measurement. That is, when a swap error exists, the wafer stage WS cannot be aligned with an optimal position or its vicinity in a direction perpendicular to the optical axis in the focus measurement. Likewise, the wafer stage WS cannot be aligned with an optimal focus position or its vicinity in the position measurement in a direction perpendicular to the optical axis. This results in erroneous measurement and in a decrease in TTL measurement accuracy.

In this embodiment, to solve the above-described problems due to the occurrence of a swap error, a rough-measurement process is performed prior to the above-described fine-measurement process. In the rough-measurement process, of the original-side fine-measurement marks Rmf and original-side rough-measurement marks Rmr formed on the reticle-side fiducial plate RFP, the original-side rough-measurement marks Rmr are used as the original-side measurement marks. Also in the rough-measurement process, of the substrate-side fine-measurement marks Wmf and substrate-side rough-measurement marks Wmr formed on the wafer-side fiducial plate WFP, the substrate-side rough-measurement marks Wmr are used as the substrate-side measurement marks.

Figure 6:
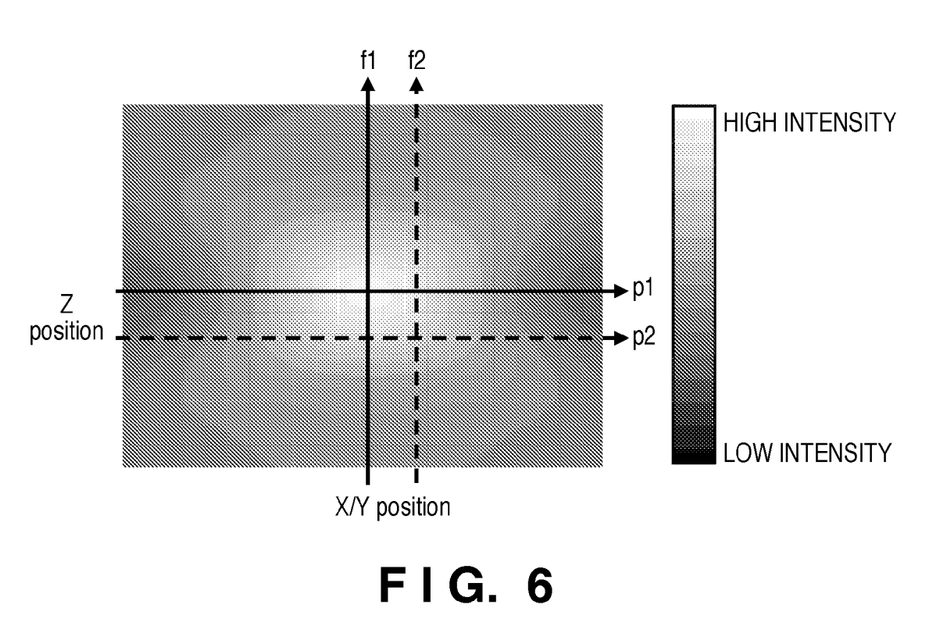
FIG. 6 is a chart illustrating an image intensity distribution on the Z-X plane, which is obtained by using the rough-measurement marks.

The marks Rmr are formed from patterns each with a width larger than the exposure resolution line width on the scale of the original. The marks Wmr are also formed from patterns each with a width larger than the exposure resolution line width. FIG. 6 illustrates an image intensity distribution obtained in the rough-measurement process. The image intensity distribution obtained in the rough-measurement process extend in both the focusing direction and a direction perpendicular to the optical axis, as compared with that obtained in the fine-measurement process. This makes it possible to reduce deterioration in measurement accuracy and the number of times of erroneous measurement due to a positional shift in a direction perpendicular to the optical axis direction in the focus measurement, and a focus positional shift in the position measurement in a direction perpendicular to the optical axis direction.

Figure 7:
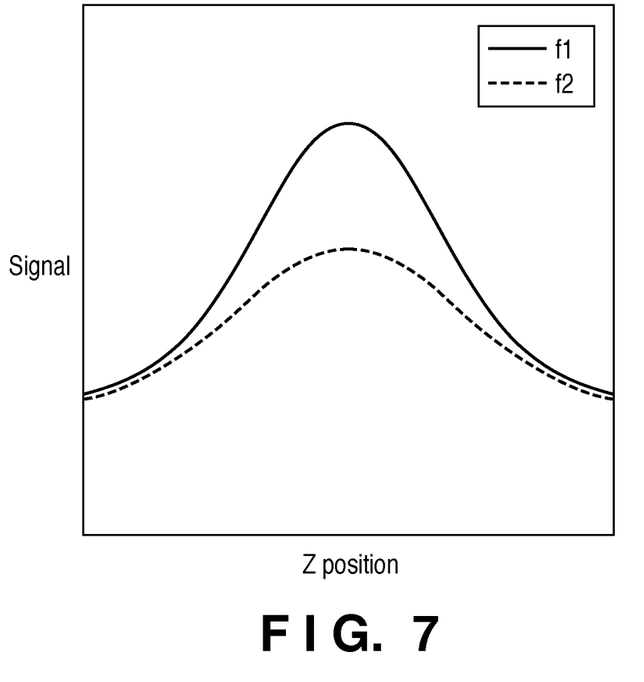
FIG. 7 is a chart illustrating signal waveforms obtained by using the rough-measurement marks.

For example, assume that focus measurement is performed in the rough-measurement process. In this case, if the position in a direction perpendicular to the optical axis is an optimal position (f1 in FIG. 6), a waveform illustrated as f1 in FIG. 7 is obtained. On the other hand, if the position in a direction perpendicular to the optical axis is not an optimal position, a waveform illustrated as f2 in FIG. 7 is obtained. When f1 and f2 in FIG. 7 are compared, the waveform f2 has a lower contrast, but its shape is not disturbed, which reveals that sufficient measurement accuracy can be obtained even in the case of f2.

Figure 8:
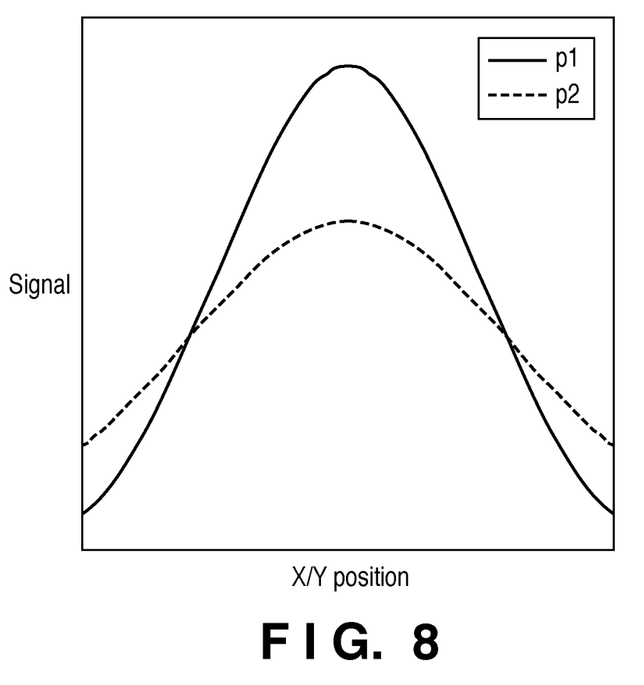
FIG. 8 is a chart illustrating signal waveforms obtained by using the rough-measurement marks.

Assume that position measurement in a direction perpendicular to the optical axis is performed in the rough-measurement process. In this case, if the position in the focusing direction is an optimal position, a waveform illustrated as p1 in FIG. 8 is obtained. On the other hand, if the position in the focusing direction is not an optimal position, a waveform illustrated as p2 in FIG. 8 is obtained. When p1 and p2 in FIG. 8 are compared, the waveform p2 has a lower contrast, but its shape is not disturbed, which reveals that a sufficient measurement accuracy can be obtained even in the case of p2.

Figure 9A:
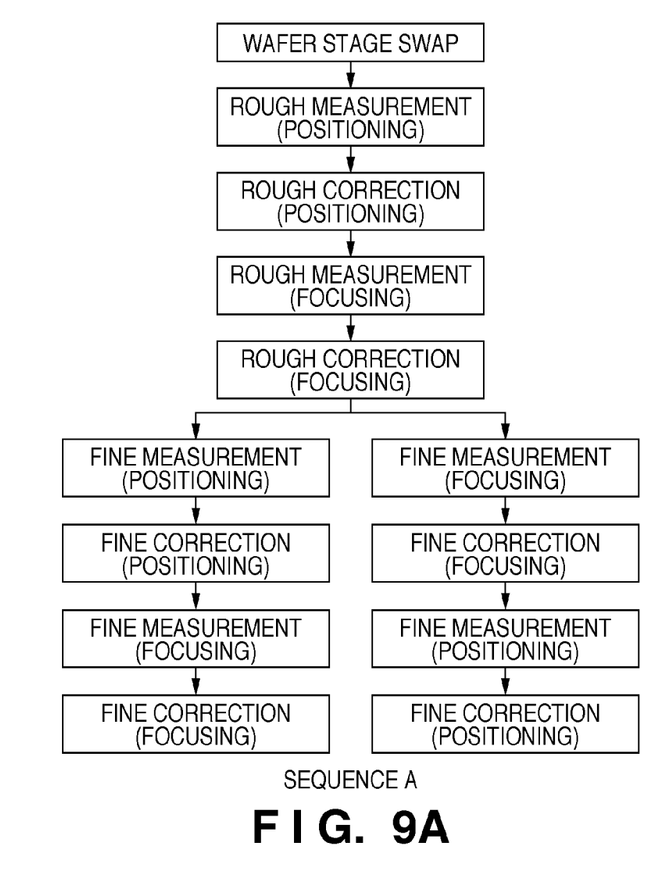
FIGS. 9A and 9B are flowcharts illustrating a measurement process.
Figure 9B:
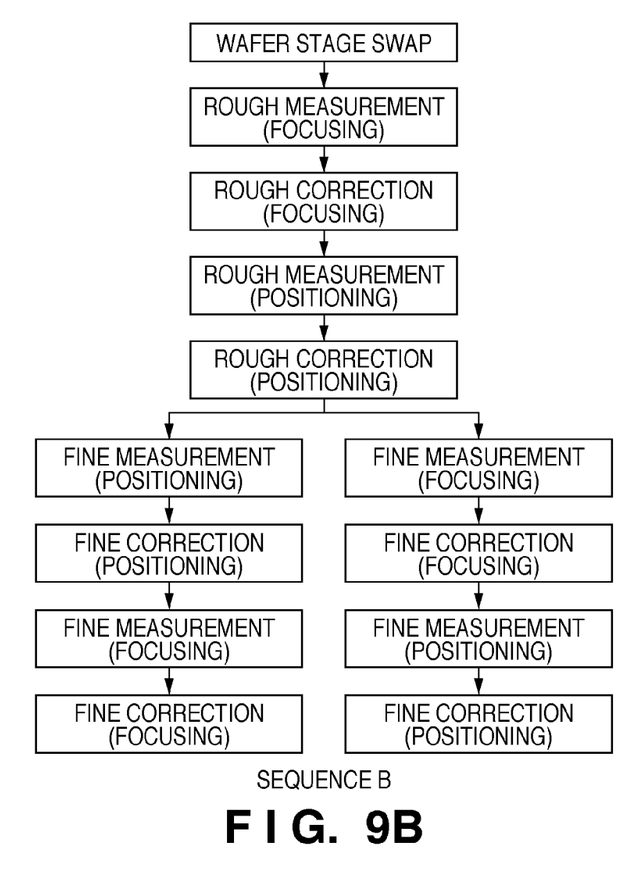

In view of this, the exposure apparatus according to this embodiment executes the rough-measurement process using the marks Rmr and Wmr, corrects the swap error based on the measurement result, and then executes the fine-measurement process using the marks Rmf and Wmf. This makes it possible to precisely align the reticle stage and wafer stage even when a swap error occurs. FIGS. 9A and 9B are flowcharts illustrating two procedures (sequences A and B) of the measurement process controlled by the control unit CNT in the exposure apparatus according to this embodiment. Note that "Positioning" means measurement or correction in a direction perpendicular to the optical axis, and "Focusing" means measurement or correction in the focusing direction.

Although the above-described measurement process is particularly suitably performed in the exposure station EST for a wafer stage which has moved from the measurement station, it may be performed in the measurement station.

Figure 10A:
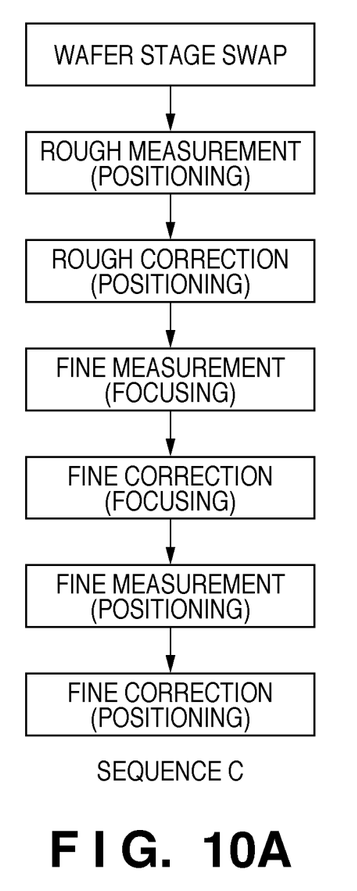
FIGS. 10A and 10B are flowcharts illustrating another measurement process.

The alignment of the wafer stage requires measurement in both the focusing direction and a direction perpendicular to the optical axis. However, from the viewpoint of shortening the measurement time, in the rough measurement the position of the wafer stage need only be corrected to fall within a detection possible range in the focusing direction or a direction perpendicular to the optical axis in the fine measurement. For example, as in sequence C shown in FIG. 10, it is possible to perform the measurement in only a direction perpendicular to the optical axis in the rough-measurement process, correct the position of the wafer stage in a direction perpendicular to the optical axis based on the measurement result, and then make a shift to the fine-measurement process. Since position correction in a direction perpendicular to the optical axis has already been performed in the fine-measurement process, focus measurement can be performed readily. In this case, it is possible to correct the position of the wafer stage in the focusing direction based on the focus measurement result obtained in the fine-measurement process, and perform fine-position-measurement in a direction perpendicular to the optical axis.

Figure 10B:
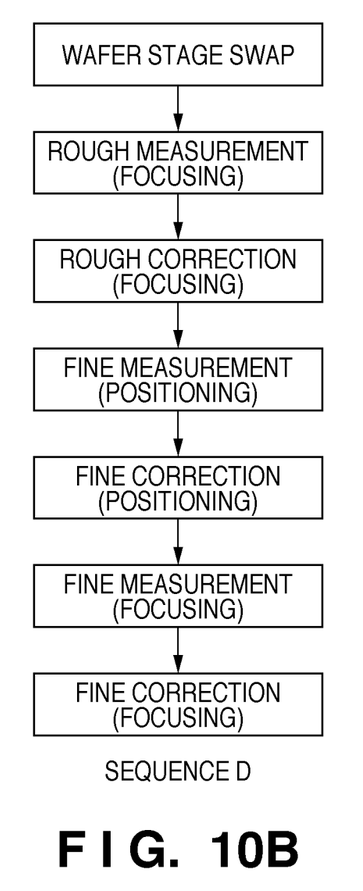

As in sequence D shown in FIG. 10, it is also possible to perform only focus measurement in the rough-measurement process, correct the position of the wafer stage in the focusing direction based on the measurement result, and then make a shift to the fine-measurement process. In the fine-measurement process, position measurement in a direction perpendicular to the optical axis, and position correction based on the measurement result are performed first, and focus measurement and position correction based on the measurement result are performed next.

In this manner, both position measurement in a direction perpendicular to the optical axis direction and focus measurement need not always be performed in the rough-measurement process, and a shift can be made to the fine-measurement process after only one of these types of measurement. This makes it possible to shorten the measurement time.

A pattern used in the rough-measurement process must have a line width that allows the formation of an aerial image having a size large enough to detect a swap error expected to occur. Note, however, that too large an aerial image generates a TTL measurement signal having a slow, blunt waveform, resulting in deterioration in TTL measurement accuracy. Hence, the line width of a pattern used in the rough-measurement process must be determined such that it ensures a detection possible range wide enough to detect a positional shift error expected to occur, and can obtain a measurement accuracy that allows sufficient position correction within the detection possible range in the fine-measurement process.

One line width selection method is a method of calculating an aerial image for TTL measurement, using, for example, an optical simulator. In the calculation of an aerial image, the pattern shape, the wavelength, information on, for example, the specification and aberration of the projection optical system PO, and information on, for example, the specification and illumination shape of the illumination optical system IL can be taken into consideration. In addition, since the signal obtained by the photosensor IS comes under influences of, for example, errors attributed to the photosensor IS and electrical factors involved, errors associated with the control of the wafer stage WS, and the environment in the exposure apparatus, the line width must be determined by taking these errors into consideration together.

When TTL measurement is performed using a plurality of types of measurement marks (patterns), the maximum value of the amount of light which enters the photosensor IS is preferably nearly the same irrespective of the type of mark used. If the maximum value of the amount of light which enters the photosensor IS largely changes depending on the type of mark, appropriate measurement cannot be performed because it falls outside the light amount detection range of the photosensor IS. Even if the maximum value falls within the light amount detection range of the photosensor IS, a difference in amount of light can have an adverse influence on the magnitude of an error.

As a method of adjusting the amount of light which enters the photosensor IS, there is a method of, for example, adjusting the amount of light emitted by the light source LS1 or performing the adjustment by providing a light amount adjusting mechanism in the illumination optical system IL. This method adjusts the amounts of light beams applied on the marks Rmf and Rmr, thereby adjusting the amount of light which enters the photosensor IS. Adjustment based on the amount of light which enters the photosensor IS for each of the plurality of types of measurement patterns allows measurement with an optimal light amount even when an arbitrary measurement pattern is used.

As another method, there is a method of selecting a relationship associated with the line width, the length, and the number of lines of the marks Rmr and Rmf such that the amounts of light beams transmitted through the marks Wmr and Wmf become equal. This makes it possible to input an optimal amount of light into the photosensor IS without another light amount adjusting mechanism.

As still another method, there is a method of intentionally shifting the relative positions between the original-side measurement marks and the substrate-side measurement marks in the non-measurement direction (the Y direction in measurement in the X direction, and the X direction in measurement in the Y direction) by shifting the relative position between the reticle stage RS and the wafer stage WS. Intentionally shifting this position makes it possible to adjust the amount of light because a deviation from a reference state in the non-measurement direction has no adverse influence on the measurement accuracy in the measurement direction. This method can increase the degree of freedom in designing the measurement pattern. This method also can input an optimal amount of light into the photosensor IS without providing an amount of light adjusting mechanism in the light source LS1 or illumination optical system IL. This method also can adjust the amount of light by merely driving the reticle stage RS or wafer stage WS. This makes it possible to quickly, finely adjust the amount of light, and suppress an increase in measurement time.

Based on the relative positional relationship between the plates RFP and WFP obtained by the above-described measurement, the relative positional relationship between the reticle RT and the wafer WF can be obtained. This is because the relationship between the plate RFP and the reticle RT can be obtained by the reticle alignment sensor RAS and reticle focus sensor RFS, and that between the plate WFP and the wafer WF can be obtained by the alignment sensor AS and focus sensor FS.

Although it is a common practice to use a pattern dedicated to the measurement of the plate WFP by the alignment sensor AS, the present invention is not particularly limited to this. For example, the marks Wmf or Wmr may be measured instead. In this case, it is possible to eliminate a measurement error of the relative positional relationship between the marks Wmf and Wmr and the pattern dedicated to the measurement by the alignment sensor AS. This makes it possible to measure the relative positional relationship between the reticle RT and the wafer WF with a higher accuracy. However, the marks Wmf are micropatterns each with a line width around the exposure resolution line width, that generally exceeds the resolution limit of the alignment sensor AS, so high-accuracy measurement often cannot be done. In contrast, the marks Wmr have a line width larger than that of the marks Wmf. When the marks Wmr are designed to have a line width that falls within the resolution limit of the alignment sensor AS, high-accuracy measurement can be done using the marks Wmr.

Although a description has been given assuming that the reticle alignment sensor RAS and reticle focus sensor RFS are different measuring systems in this embodiment, the present invention is not particularly limited to this, and the relative positional relationship between the plate RFP and the reticle RT may be measured using the same measuring system. Likewise, although a description has been given assuming that the alignment sensor AS and focus sensor FS are different measuring systems, the present invention is not limited to this, and the relative positional relationship between the plate WFP and the wafer WF may be measured using the same measuring system.

Second Embodiment

Figure 11:
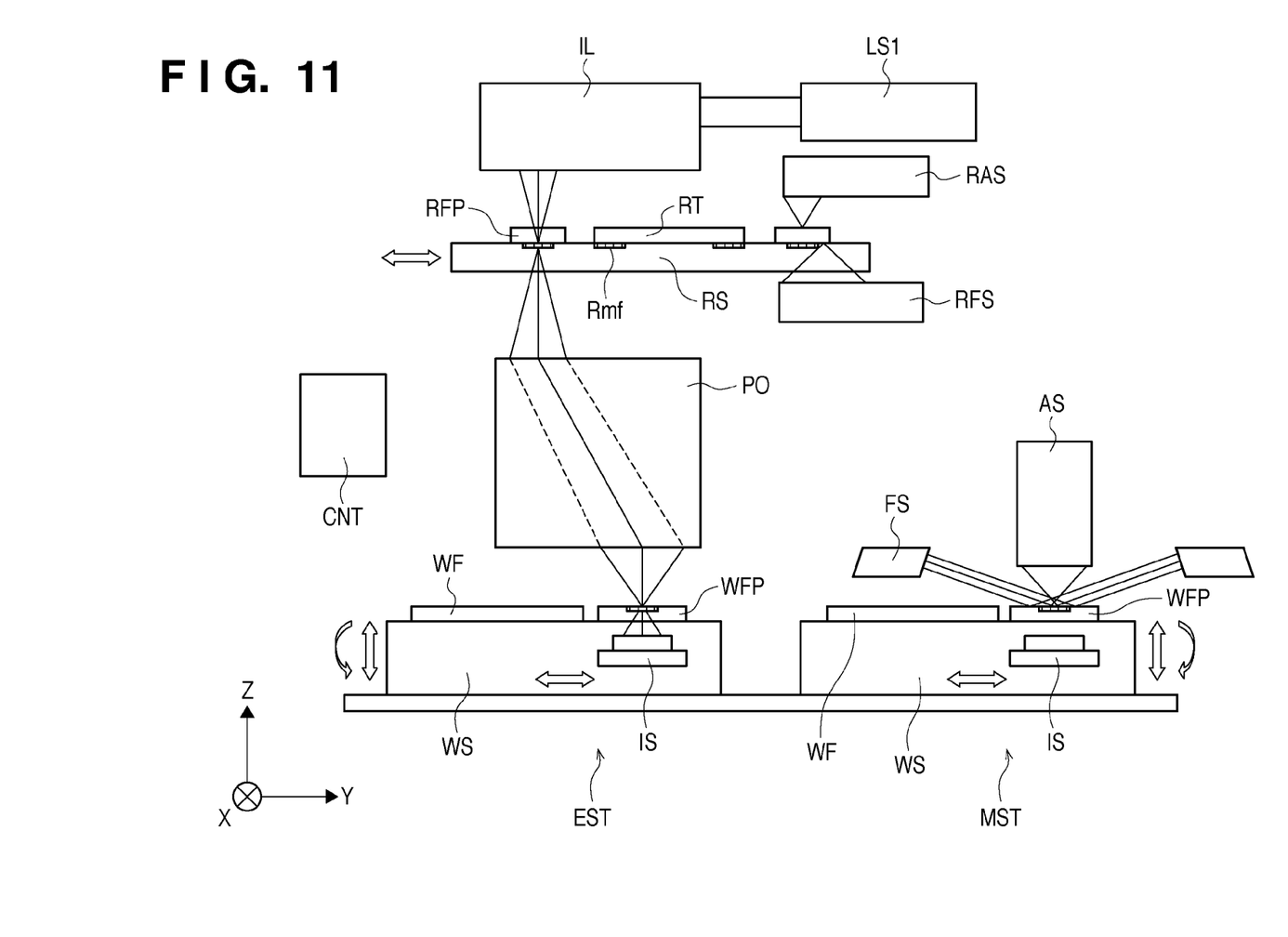
FIG. 11 is a view showing the schematic arrangement of an exposure apparatus according to the second embodiment of the present invention.

The second embodiment of the present invention will be explained. FIG. 11 is a view showing the schematic arrangement of an exposure apparatus according to the second embodiment of the present invention. Original-side fine-measurement marks Rmf are formed on a reticle stage RS. Original-side rough-measurement marks Rmr are patterns for correcting a position error which occurs upon swapping wafer stages WS in a twin-stage exposure apparatus. The marks Rmf are therefore important elements of the exposure apparatus. Forming marks Rmf on a reticle-side fiducial plate RFP arranged on the reticle stage RS makes it possible to align the plate RFP and a plate WFP with high accuracy. However, the final alignment targets are a reticle RT and wafer WF. Although a method of measuring and correcting the relative positional relationship between the plate RFP and the reticle RT using a reticle alignment sensor RAS and reticle focus sensor RFS is available, the magnitude of an error increases qualitatively as the number of constituent elements increases. In this embodiment, the magnitude of an error is reduced by decreasing the number of constituent elements by forming marks Rmf on the reticle RT. This makes it possible to eliminate an error which occurs upon measuring the relative positional relationship between the plate RFP and the reticle RT. In addition, forming a plurality of marks Rmf on the reticle RT allows various types of measurement. For example, it is possible to measure components of, for example, the magnification in the X direction, distortion, image plane, tilt, and rotation for the reticle RT by forming a plurality of marks Rmf at a predetermined distance in the X direction, and performing TTL measurement. Likewise, it is possible to measure components of, for example, the magnification in the Y direction, distortion, image plane, tilt, and rotation for the reticle RT by forming a plurality of marks Rmf at a predetermined distance in the Y direction, and performing TTL measurement.

These types of measurement are necessary because the relative positional relationship between the plate RFP and the reticle RT changes depending on the state in which the reticle RT is mounted on the reticle stage RS. Due to the change in relative positional relationship, the marks Rmf formed on the reticle RT may be measured at erroneous positions, resulting in erroneous measurement. To avoid this situation, the relative positional relationship between the marks Rmr formed on the plate RFP and those Rmf formed on the reticle RT is desirably measured in advance.

An example of a method of obtaining this relative positional relationship is a method of measuring a measurement mark (not shown) on the reticle RT and that (not shown) on the plate RFP using the reticle alignment sensor RAS, thereby obtaining the relative positional relationship in the X and Y directions. In this case, the mark on the reticle RT and that on the plate RFP may be anything as long as they can be measured with a measurement accuracy that can adjust the position in the X and Y directions to fall within the detection range of the marks Rmf. For example, the mark on the reticle RT and that on the plate RFP may be the same or different, or the marks Rmf and Rmr may be measured instead. The relative position in the Z direction can be obtained by measuring the marks Rmf on the reticle RT and those on the plate RFP using the reticle focus sensor RFS. Although the marks Rmf and Rmr may be measured directly, the vicinities of the marks Rmf and Rmr may be measured approximately. Alternatively, the relative positional relationship between the marks Rmf and Rmr may be measured by measuring a predetermined position on the reticle RT and that on the plate RFP, and converting the measured positions into the positions of the marks Rmf and Rmr.

As another method of obtaining the relative positional relationship, there is a method of performing TTL measurement of the relative positional relationship between the marks Rmr on the plate RFP and those Wmr on the plate WFP first, and performing TTL measurement using the marks Rmf on the reticle RT and those Wmf on the plate WFP next. This makes it possible to measure the relative positional relationship between the marks Rmr on the plate RFP and those Rmf on the reticle RT.

As still another method of obtaining the relative positional relationship, there is a method of performing TTL measurement of the relative positional relationship between the marks Rmr on the plate RFP and those Wmr on the plate WFP first, and performing TTL measurement of the relative positional relationship between the marks Rmf on the plate RFP and those Wmf on the plate WFP next. Then, TTL measurement is performed using the marks Rmf on the reticle RT and those Wmf on the plate WFP. This makes it possible to measure the relative positional relationship between the marks Rmr on the plate RFP and those Rmf on the reticle RT.

The relative positional relationship is desirably measured during the time from when the reticle RT has been mounted on the reticle stage RS until a device pattern starts being transferred by exposure.

Although the relative positional relationship between the reticle RT and the plate WFP is obtained in this embodiment, the relationship between the reticle RT and the wafer WF can be obtained by obtaining the relationship between the plate WFP and the wafer WF by the alignment sensor AS and focus sensor FS.

Although a description has been given assuming that the reticle alignment sensor RAS and reticle focus sensor RFS are different measuring systems in this embodiment, the present invention is not particularly limited to this, and the relative positional relationship between the plate RFP and the reticle RT may be obtained using the same measuring system. Likewise, although a description has been given assuming that the alignment sensor AS and focus sensor FS are different measuring systems, the present invention is not particularly limited to this, and the relative positional relationship between the plate WFP and the wafer WF may be obtained using the same measuring system.

Although marks Rmr are not formed on the reticle RT in this embodiment, the present invention is not particularly limited to this, and they may be formed on the reticle RT. This makes it possible to directly perform TTL measurement of the reticle RT and plate WFP without the plate RFP even after swapping the wafer stages WS.

However, a device pattern, other measurement patterns, and the like are formed on the reticle RT. If interference between these pattern regions, a decrease in the number of pattern regions involved, or the like occurs, marks Rmr are desirably formed on the plate RFP.

[Supplement]

Although a description has been given by taking the marks Rmf and Wmf together in FIG. 2B, and taking the marks Rmr and Wmr together in FIG. 2C, the marks taken together have a difference in magnification corresponding to the optical magnification of the projection optical system PO in practice. The marks Rmr and Wmr need not always be similar. For example, even when the marks Wmr each have a smaller line width than in the above description, a sufficient effect can be obviously produced from the viewpoint of measuring an aerial image formed near the image plane of the projection optical system PO by the marks Rmr. In this case, rough measurement may be performed using the marks Wmf.

Although the first and second embodiments have exemplified an exposure apparatus configured as a scanner, the exposure apparatus according to the present invention is also applicable to a stepper.

Although how to correct a swap error has been explained in the first and second embodiments, the present invention is also useful in a situation in which the continuity of measurement by measuring devices breaks. For example, the present invention is also useful in, for example, the initialization, maintenance, and start-up of an exposure apparatus and measuring devices. The number of wafer stages is not particularly limited, and the present invention is also useful when one wafer stage is used.

[Device Manufacturing Method]

A device manufacturing method according to a preferred embodiment of the present invention is suitable to manufacture, for example, a semiconductor device and liquid crystal device. This method can include a step of transferring the pattern of an original onto a photosensitive agent applied on a substrate using the above-described exposure apparatus, and a step of developing the photosensitive agent. After these steps, other known steps (e.g., etching, resist removal, dicing, bonding, and packaging) are performed, thereby manufacturing devices.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-271782, filed Oct. 18, 2007, which is hereby incorporated by reference herein in its entirety.

What is claimed is:

1. An exposure apparatus which projects a pattern of an original onto a substrate by a projection optical system to expose the substrate, comprising:

an original stage configured to hold the original, wherein an original-side rough-measurement mark and an original-side fine-measurement mark, which have geometric arrangements different from each other, are arranged on said original stage;

a substrate stage configured to hold the substrate, wherein a substrate-side rough-measurement mark and a substrate-side fine-measurement mark, which have geometric arrangements different from each other, are formed on said substrate stage;

a control unit configured to control a measurement process for measuring a relative position between said original stage and said substrate stage; and a photosensor having a light amount detection range and configured to detect, in a state that the relative position between said original stage and said substrate stage is changed, a first waveform indicating a change in an amount of light transmitted through said original-side rough-measurement mark, the projection optical system, and said substrate-side rough-measurement mark, and a second waveform indicating a change in an amount of light transmitted through said original-side fine-measurement mark, the projection optical system, and said substrate-side fine-measurement mark, and said control unit controls the measurement process to perform rough measurement for measuring the relative position between said original stage and said substrate stage by detecting, using said photosensor, the first waveform while changing the relative position between said original stage and said substrate stage, correct the relative position between said original stage and said substrate stage based on the result of the rough measurement, and then perform fine measurement for measuring the relative position between said original stage and said substrate stage by detecting, using said photosensor, the second waveform while changing the relative position between said original stage and said substrate stage, wherein the geometric arrangements of said original-side rough-measurement mark, said original-side fine-measurement mark, said substrate-side rough-measurement mark and said substrate-side fine-measurement mark are determined so that a maximum value in the first waveform and a maximum value in the second waveform fall within the light amount detection range of said photosensor.

2. The apparatus according to claim 1, wherein said photosensor is arranged on said substrate stage.

3. The apparatus according to claim 1, further comprising a measurement station in which measurement for obtaining information used to align the original and a shot region on the substrate is performed, and an exposure station in which the substrate and the original are aligned based on the information obtained by the measurement in said measurement station, and the pattern of the original is projected onto the substrate by the projection optical system to expose the substrate, wherein said substrate stage moves from said measurement station to said exposure station after the substrate held by said substrate stage is measured in said measurement station.

4. The apparatus according to claim 1, wherein said original-side fine-measurement mark is formed on the original and a device pattern to be transferred to the substrate is formed on the original.

5. The apparatus according to claim 1, wherein said original-side rough-measurement mark has a pattern with a line width larger than a line width of a pattern of said original-side fine-measurement mark, said substrate-side rough-measurement mark has a pattern with a line width larger than a line width of a pattern of said substrate-side fine-measurement mark, and lengths and the number of lines of said substrate-side rough-measurement mark is determined so that an amount of light which is transmitted through said substrate-side rough-measurement mark and detected by said photosensor equals to an amount of light which is transmitted through said substrate-side fine-measurement mark and detected by said photosensor.

6. The apparatus according to claim 1, wherein said control unit shifts relative positions of said original-side measurement marks and said substrate-side measurement marks in a non-measurement direction thereof so as to reduce a difference between the maximum values.

7. An exposure apparatus which projects a pattern of an original onto a substrate by a projection optical system to expose the substrate, comprising:
an original stage configured to hold the original;
a substrate stage configured to hold the substrate; and
a control unit configured to control a measurement process for measuring a relative position between said original stage and said substrate stage, wherein original-side measurement marks including an original-side rough-measurement mark and an original-side fine-measurement mark are arranged on said original stage, substrate-side measurement marks including a substrate-side rough-measurement mark and a substrate-side fine-measurement mark are formed on said substrate stage, said control unit controls the measurement process to perform rough measurement for measuring the relative position between said original stage and said substrate stage using said original-side rough-measurement mark and said substrate-side rough-measurement mark, correct the relative position between said original stage and said substrate stage based on the result of the rough measurement, and then perform fine measurement for measuring the relative position between said original stage and said substrate stage using said original-side fine-measurement mark and said substrate-side fine-measurement mark, and wherein a photosensor is configured to detect light transmitted through said original-side measurement marks, the projection optical system, and said substrate-side measurement marks while said original-side measurement marks are illuminated, and in the measurement process, the relative position between said original stage and said substrate stage is measured based on the detection result obtained by said photosensor while moving said substrate stage, wherein said control unit controls the measurement process so that a maximum value of an amount of light which is transmitted through said original-side rough-measurement mark, the projection optical system, and said substrate-side rough-measurement mark, and detected by said photosensor becomes equal to a maximum value of an amount of light which is transmitted through said original-side fine-measurement mark, the projection optical system, and said substrate-side fine-measurement mark, and detected by said photosensor, and wherein said control unit shifts relative positions between said original-side measurement marks and said substrate-side measurement marks in a non-measurement direction thereof so that the maximum values become equal to each other.

8. A device manufacturing method comprising the steps of:
exposing a substrate using an exposure apparatus; and
developing the substrate,
wherein the exposure apparatus is configured to project a pattern of an original onto a substrate by a projection optical system to expose the substrate, and comprises:
an original stage configured to hold the original, wherein an original-side rough-measurement mark and an original-side fine-measurement mark, which have geometric arrangements different from each other, are arranged on said original stage;
a substrate stage configured to hold the substrate, wherein a substrate-side rough-measurement mark and a substrate-side fine-measurement mark, which have geometric arrangements different from each other, are formed on said substrate stage;
a control unit configured to control a measurement process for measuring a relative position between said original stage and said substrate stage; and
a photosensor having a light amount detection range and configured to detect, in a state that the relative position between said original stage and said substrate stage is changed, a first waveform indicating a change in an amount of light transmitted through said original-side rough-measurement mark, the projection optical system, and said substrate-side rough-measurement mark, and a second waveform indicating a change in an amount of light transmitted through said original-side fine-measurement mark, the projection optical system, and said substrate-side fine-measurement mark, and said control unit controls the measurement process to perform rough measurement for measuring the relative position between said original stage and said substrate stage by detecting, using said photosensor, the first waveform while changing the relative position between said original stage and said substrate stage, correct the relative position between said original stage and said substrate stage based on the result of the rough measurement, and then perform fine measurement for measuring the relative position between said original stage and said substrate stage by detecting, using said photosensor, the second waveform while changing the relative position between said original stage and said substrate stage, wherein the geometric arrangements of said original-side rough-measurement mark, said original-side fine-measurement mark, said substrate-side rough-measurement mark and said substrate-side fine-measurement mark are determined so that a maximum value in the first waveform and a maximum value in the second waveform fall within the light amount detection range of said photosensor.

* * * * *